(12) United States Patent
Lin et al.

(10) Patent No.: US 9,106,189 B2
(45) Date of Patent: Aug. 11, 2015

(54) OPERATIONAL AMPLIFIER CIRCUIT AND METHOD FOR ENHANCING DRIVING CAPACITY THEREOF

(71) Applicant: Novatek Microelectronics Corp., Hsinchu (TW)

(72) Inventors: Chieh-An Lin, Hsinchu (TW); Chun-Yung Cho, Hsinchu County (TW); Ju-Lin Huang, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 43 days.

(21) Appl. No.: 14/016,136

(22) Filed: Sep. 2, 2013

(65) Prior Publication Data

US 2014/0218111 A1    Aug. 7, 2014

(30) Foreign Application Priority Data

Feb. 20, 2013   (TW) .............................. 102105894 A (51) Int. Cl.
*H03F 3/45*   (2006.01)
*H03F 3/30*   (2006.01)

(52) U.S. Cl.
CPC .......... *H03F 3/45192* (2013.01); *H03F 3/3022* (2013.01)

(58) Field of Classification Search
CPC ..................................... H03F 3/26; H03F 3/45
USPC .................................... 330/255, 265; 345/204
See application file for complete search history.

(56) References Cited

U.S. PATENT DOCUMENTS 8,686,987 B2 *   4/2014   Tsuchi .......................... 345/212

* cited by examiner

*Primary Examiner* — Steven J Mottola
(74) *Attorney, Agent, or Firm* — Jiang Chyun IP Office (57) ABSTRACT

An operational amplifier circuit configured to drive a load is provided. The operational amplifier circuit includes an output stage module. The output stage module includes a detection circuit and an output stage circuit. The detection circuit is configured to detect a current output voltage and a previous output voltage based on a comparison result of a current input voltage and the current output voltage. The detection circuit enhances a charge capacity or a discharge capacity of the output stage circuit for the load based on a detection result. Furthermore, a method for enhancing the driving capacity of the operational amplifier circuit is also provided.

10 Claims, 9 Drawing Sheets

OPERATIONAL AMPLIFIER CIRCUIT AND METHOD FOR ENHANCING DRIVING CAPACITY THEREOF

CROSS-REFERENCE TO RELATED APPLICATION

This application claims the priority benefit of Taiwan application serial no. 102105894, filed on Feb. 20, 2013. The entirety of the above-mentioned patent application is hereby incorporated by reference herein and made a part of this specification.

BACKGROUND OF THE DISCLOSURE

1. Field of the Disclosure

The disclosure relates to an electronic circuit and a method for improving circuit features thereof, and more particularly to an operational amplifier circuit and a method for enhancing the driving capacity thereof.

2. Description of Related Art

An output stage operational amplifier plays an important role in integrated circuit design while being widely used in tranceivers for telecommunication and/or television broadcast, high-definition stereo audio equipments, micro computers or other electronic devices. The output stage operational amplifier is configured to enhance a signal energy for driving a load or a next-stage circuit. A conventional linear power amplifier such as class A, class B and class AB amplifiers fix the bias-voltage of an active device to a direct current, so as to obtain a favorable linearity.

However, when it is applied in a driving chip of a large-sized panel, if the operating sequence of the driving chip is increased or a size of said panel is enlarged, insufficient charge/discharge capacity for the load or the next-stage circuit may occur to the output stage operational amplifier. Generally, a magnitude of the driving current of the output stage operational amplifier is determined based on a chip dimension thereof. Therefore, the charge/discharge capacity of the driving chip may usually be improved by increasing a dimension of the output stage operational amplifier. However, by doing so, a dimension of the driving chip may also be increased to increase manufacturing costs.

SUMMARY OF THE DISCLOSURE

The disclosure is directed to an operational amplifier circuit capable of dynamically detecting magnitude of an output voltage, so as to enhance a driving capacity of an output stage circuit.

The disclosure is also directed to a method for enhancing the driving capacity of an operational amplifier circuit, capable of dynamically detecting magnitude of an output voltage, so as to enhance a driving capacity of an output stage circuit.

An operational amplifier circuit configured to drive a load is provided. The operational amplifier circuit includes an output stage module. The output stage module includes a detection circuit and an output stage circuit. The detection circuit is configured to detect a current output voltage and a previous output voltage based on a comparison result of a current input voltage and the current output voltage. The detection circuit enhances a charge capacity or a discharge capacity of the output stage circuit for the load based on a detection result.

According to an embodiment of the disclosure, the detection circuit enhances the charge capacity of the output stage circuit for the load when the previous output voltage is greater than the current output voltage based on the detection result.

According to an embodiment of the disclosure, the detection circuit enhances the discharge capacity of the output stage circuit for the load when the previous output voltage is less than the current output voltage based on the detection result.

According to an embodiment of the disclosure, the output stage circuit includes a first transistor and a second transistor. The first transistor has a first terminal, a second terminal, and a control terminal. The first terminal of the first transistor is coupled to a first voltage. The second terminal of the first transistor is served as an output terminal of the output stage circuit. The control terminal of the first transistor is coupled to the detection circuit. The detection circuit turns on the first transistor by decreasing a voltage of a control terminal of first transistor, so as to enhance the charge capacity of the output stage circuit for the load. The second transistor has a first terminal, a second terminal, and a control terminal. The first terminal of the second transistor is coupled to the first terminal of the first transistor. The second terminal of the second transistor is coupled to a second voltage. The control terminal of the second transistor is coupled to the detection circuit. The detection circuit turns on the second transistor by increasing a voltage of a control terminal of second transistor, so as to enhance the discharge capacity of the output stage circuit for the load.

According to an embodiment of the disclosure, the output stage circuit further includes a first current source. The first current source has a first terminal and a second terminal. The first terminal of the first current source is coupled to a first voltage. The second terminal of the first current source is coupled to the control terminal of the first transistor. When the first current source is turned on, the voltage of the control terminal of the second transistor is increased to turn on the second transistor, so as to enhance the discharge capacity of the output stage circuit for the load.

According to an embodiment of the disclosure, the output stage circuit further includes a second current source. The second current source has a first terminal and a second terminal. The first terminal of the second current source is coupled to the control terminal of the second transistor. The second terminal of the second current source is coupled to a second voltage. When the second current source is turned on, the voltage of the control terminal of the first transistor is decreased to turn on the first transistor, so as to enhance the charge capacity of the output stage circuit for the load.

According to an embodiment of the disclosure, the output stage circuit includes a third transistor and a fourth transistor. The third transistor has a first terminal, a second terminal, and a control terminal. The first terminal of the third transistor is coupled to a first voltage. The second terminal of the third transistor is served as an output terminal of the output stage circuit. The control terminal of the third transistor is coupled to the detection circuit. The detection circuit turns on the third transistor by increasing a voltage of a control terminal of third transistor, so as to enhance the charge capacity of the output stage circuit for the load. The fourth transistor has a first terminal, a second terminal, and a control terminal. The first terminal of the fourth transistor is coupled to the first terminal of the third transistor. The second terminal of the fourth transistor is coupled to a second voltage. The control terminal of the fourth transistor is coupled to the detection circuit. The detection circuit turns on the fourth transistor by decreasing a voltage of a control terminal of fourth transistor, so as to enhance the discharge capacity of the output stage circuit for the load.

According to an embodiment of the disclosure, the output stage circuit includes a third current source and a fifth transistor. The third current source has a first terminal and a second terminal. The first terminal of the third current source is coupled to a first voltage. The second terminal of the third current source is coupled to the output terminal of the output stage circuit. When the current source is turned on, the current source may charge the load, so as to enhance the charge capacity of the output stage circuit for the load. The fifth transistor has a first terminal, a second terminal, and a control terminal. The first terminal of the fifth transistor is coupled to the output terminal of the output stage circuit. The second terminal of the fifth transistor is coupled to a second voltage. The control terminal of the fifth transistor is coupled to the detection circuit. The detection circuit turns on the fifth transistor by increasing a voltage of a control terminal of fifth transistor, so as to enhance the discharge capacity of the output stage circuit for the load.

According to an embodiment of the disclosure, the output stage circuit includes a first control terminal and a second control terminal. Further, the detection circuit includes a differential input pair, a first current mirror module and a second current mirror module. The differential input pair has a first terminal and a second terminal. The first terminal of the differential input pair receives the previous output voltage. The second terminal of the differential input pair receives the current output voltage. The first current mirror module is coupled to the differential input pair, and controlled by an enable signal. When the previous output voltage is greater than the current output voltage, the first current mirror module provides a first current to the first control terminal based on the enable signal. The second current mirror module is coupled to the differential input pair, and controlled by the enable signal. When the previous output voltage is less than the current output voltage, the second current mirror module draws a second current from the second control terminal based on the enable signal.

According to an embodiment of the disclosure, the output stage circuit includes a first control terminal and a second control terminal. Further, the detection circuit includes a differential input pair, a first switch and a second switch. The differential input pair has a first terminal and a second terminal. The first terminal of the differential input pair receives the previous output voltage. The second terminal of the differential input pair receives the current output voltage. The first switch has a first terminal, a second terminal, and a control terminal. The first terminal of the first switch is coupled to the first control terminal via a third current mirror module. The second terminal of the first switch is coupled to the differential input pair. The control terminal of the first switch is controlled by the enable signal. When the previous output voltage is greater than the current output voltage, the enable signal turns on the first switch as for the third current mirror module to provide a third current to the first control terminal. The second switch has a first terminal, a second terminal, and a control terminal. The first terminal of the second switch is coupled to the differential input pair. The second terminal of the second switch is coupled to the second control terminal via a fourth current mirror module. The control terminal of the second switch is controlled by the enable signal. When the previous output voltage is less than the current output voltage, the enable signal turns on the second switch as for the fourth current mirror module to draw a fourth current from the second control terminal.

According to an embodiment of the disclosure, the detection circuit includes a comparator circuit. The comparator circuit is configured to compare the current output voltage and the previous output voltage. The comparator circuit includes a first input terminal, a second input terminal, a control terminal and an output terminal. The first input terminal of the comparator circuit receives the previous output voltage. The second input terminal of the comparator circuit receives the current output voltage. The output terminal of the comparator circuit outputs a comparison result of the current output voltage and the previous output voltage. The control terminal of the comparator circuit receives an enable signal. The comparator circuit determines whether to compare the current output voltage and the previous output voltage based on the enable signal.

According to an embodiment of the disclosure, when the current input voltage is greater or less than the current output voltage, the detection circuit is enabled to detect the current output voltage and the previous output voltage.

According to an embodiment of the disclosure, the operational amplifier circuit further includes a pre-stage operational amplifier. The pre-stage operational amplifier is coupled to the output stage module, configured to compare the current input voltage and the current output voltage, and output an enable signal to the detection circuit based on the comparison result. The detection circuit determines whether to detect the current output voltage and the previous output voltage based on the enable signal.

A method for enhancing the driving capacity of the operational amplifier circuit is also provided. The operational amplifier circuit is configured to drive the load. The method includes the following steps: comparing a current input voltage and a current output voltage, and generating an enable signal based on a comparison result; detecting the current output voltage and a previous output voltage based on the enable signal; and enhancing a charge capacity or a discharge capacity of the output stage circuit for the load.

According to an embodiment of the disclosure, the step of enhancing the charge capacity or the discharge capacity of the output stage circuit for the load further includes enhancing the charge capacity of the output stage circuit for the load when the previous output voltage is greater than the current output voltage based on the detection result According to an embodiment of the disclosure, the step of enhancing the charge capacity or the discharge capacity of the output stage circuit for the load further includes enhancing the discharge capacity of the output stage circuit for the load when the previous output voltage is less than the current output voltage based on the detection result According to an embodiment of the disclosure, in the step of comparing the current input voltage and the current output voltage, when the current input voltage is greater or less than the current output voltage, the enable signal is generated for detecting the current output voltage and the previous output voltage.

Based on above, according to the embodiments of the disclosure, the output stage module of the operational amplifier circuit includes the detection circuit. The detection circuit may dynamically detect the magnitude of the output voltage, so as to enhance the charge or discharge capacity of the output circuit for the load or the next-stage circuit.

To make the above features and advantages of the disclosure more comprehensible, several embodiments accompanied with drawings are described in detail as follows.

DESCRIPTION OF THE EMBODIMENTS

Figure 1:
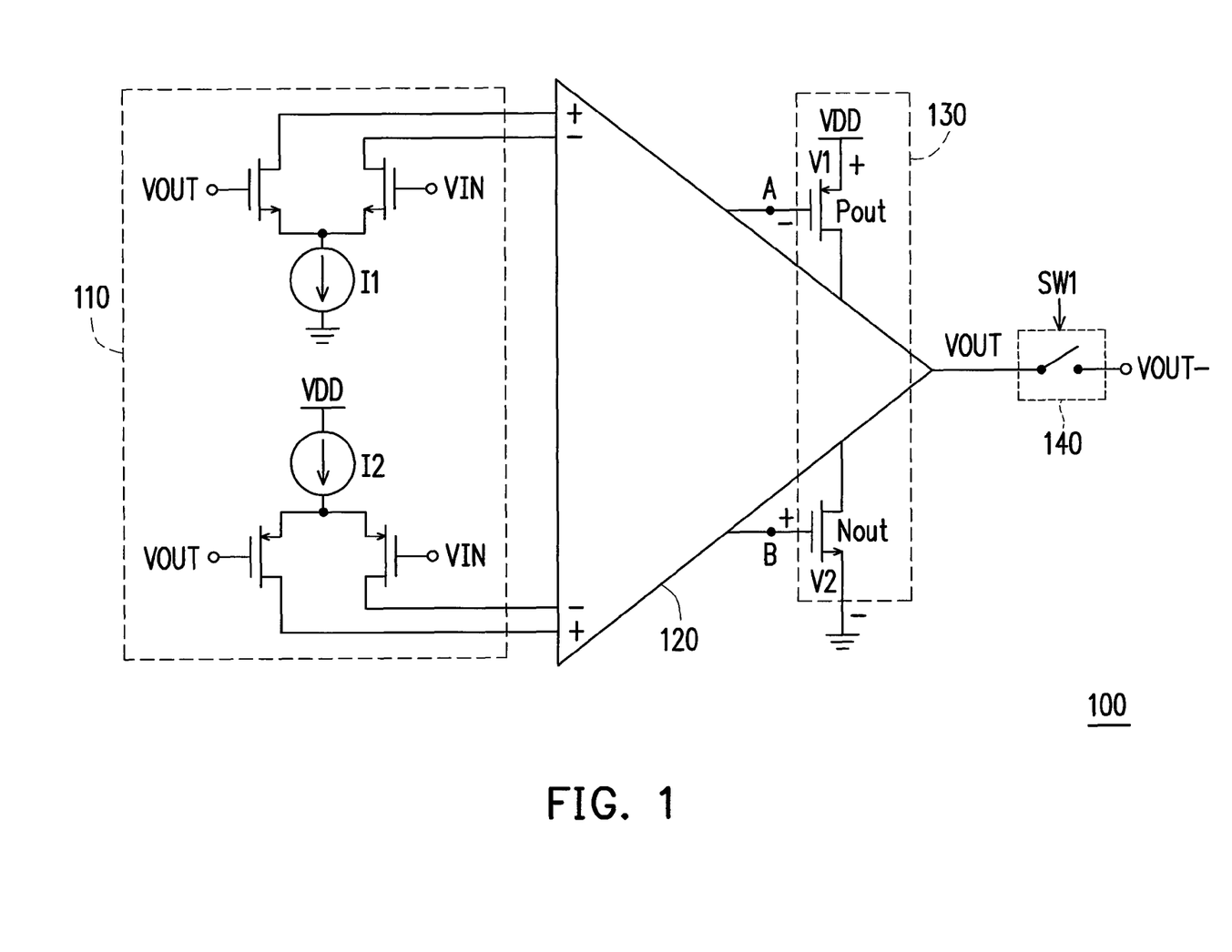
FIG. 1 is a schematic circuit diagram illustrating an operational amplifier circuit according to an embodiment of the disclosure.

FIG. 1 is a schematic circuit diagram illustrating an operational amplifier circuit according to an embodiment of the disclosure. Referring to FIG. 1, an operational amplifier circuit 100 of the present embodiment may be, for example, applied to a driving chip of a display panel having a class AB output stage circuit 130. A driving capacity of the class AB output stage circuit 130 such as a charge/discharge capacity for a load or a next-stage circuit (not illustrated) is determined based on a size of output stage transistors Pout and Nout. Under such structure, the driving capacity of the driving chip for the display panel may only be enhanced by increasing the size of the output stage transistors Pout and Nout. However, by doing so, a dimension of the driving chip may also be increased to increase manufacturing costs.

In the present embodiment, when the class AB output stage circuit 130 charges/discharges the load or the next-stage circuit, the output current value thereof may also be determine by gate-to-source voltage drops V1 and V2 of the output stage transistors Pout and Nout. Accordingly, if a magnitude of the gate-to-source voltage drops V1 and V2 may be adjusted with the same circuitry, a greater current may be provided by the output stage transistor of the same size, so as to increase the driving capacity of the operational amplifier circuit. The detection circuit of the disclosure may dynamically detect an output voltage value of the output stage circuit at least based on above-said concept, so as to adjust the magnitude of the gate-to-source voltage drops V1 and V2 of the output stage transistors. At least one embodiment accompanied with drawings is described below to further illustrate the disclosure in more detail.

Figure 2:
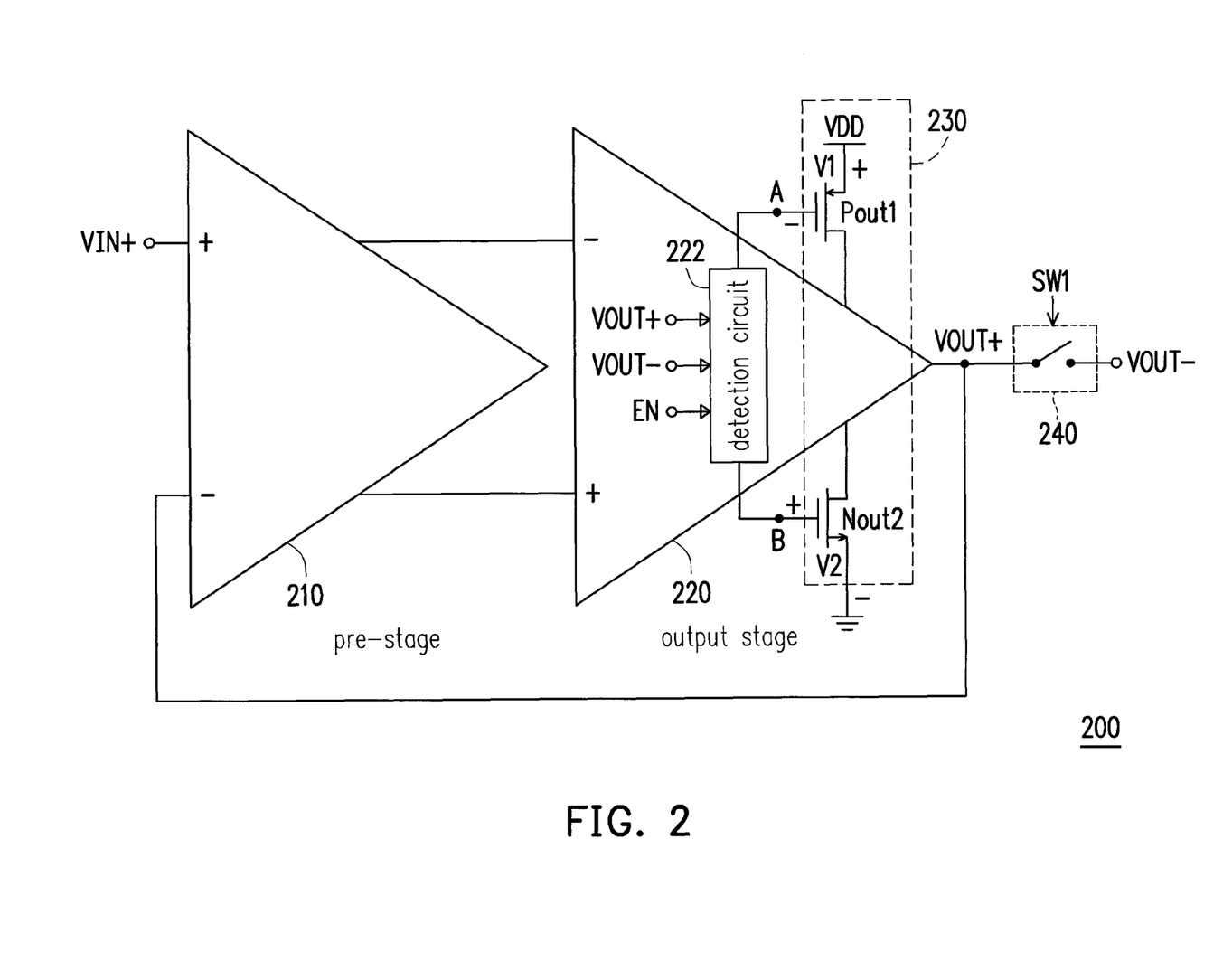
FIG. 2 is a schematic circuit diagram illustrating an operational amplifier circuit according to another embodiment of the disclosure.

FIG. 2 is a schematic circuit diagram illustrating an operational amplifier circuit according to another embodiment of the disclosure. Referring to FIG. 2, an operational amplifier circuit 200 of the present embodiment is configured to drive a load (e.g., a data line) on the display panel. The operational amplifier circuit 200 may be roughly divided into two circuit stages including a pre-stage and an output stage, in which the pre-stage includes a pre-stage operational amplifier 210, whereas the output stage includes an output stage module. In the present embodiment, the output stage module includes an output stage operational amplifier 220 and an output stage circuit 230. At least, for purpose of detecting the output voltage value, a detection circuit 222 is disposed in the output stage operational amplifier 220 for detecting a current output voltage VOUT+ and a previous output voltage VOUT− of the output stage circuit 230. Herein, the previous output voltage VOUT− may be, for example, a previous data voltage output by the operational amplifier circuit 200 which is configured to drive a data line on the display panel. The current output voltage VOUT+ may be, for example, a next data voltage to be output by the operational amplifier circuit 200 which is also configured to drive the data line on the display panel. Accordingly, an output switch 240 is further disposed in the present embodiment to reduce influences by both the current output voltage VOUT+ and the previous output voltage VOUT−, such that when detecting the output voltage and adjusting gate-to-source voltage drops, the influences by the previous output voltage VOUT− to the current output voltage VOUT+ may also be reduced. It should be noted that, although it is described using the detection circuit 222 being disposed in the output stage operational amplifier 220 as an example, the disclosure is not limited thereto.

More specifically, the pre-stage operational amplifier 210 of the present embodiment is coupled to the output stage operational amplifier 220 of the output stage module, and configured to compare a current input voltage VIN+ and the current output voltage VOUT+, so as to output an enable signal EN to the detection circuit 222 based on a comparison result for dynamically detecting the output voltage value. Therefore, the detection circuit 222 may determine whether to detect the current output voltage VOUT+ and the previous output voltage VOUT− based on the enable signal EN. In the present embodiment, when the current input voltage VIN+ is greater or less than the current output voltage VOUT+, it indicates that driving capacity of the operation amplifier circuit 200 may require an adjustment. As such, the detection circuit 222 is then enabled to detect the current output voltage VOUT+ and the previous output voltage VOUT−, so as enhance the driving capacity thereof. On the contrary, when the current input voltage VIN+ is equal to the current output voltage VOUT+, operations to enhance the driving capacity are not performed by the detection circuit 222. In addition, a specific implementation for the pre-stage operational amplifier 210 may be, for example, identical to the circuit structure of the pre-stage operational amplifier 110 depicted in FIG. 1, thus related description is omitted herein.

In the present embodiment, the detection circuit 222 is enabled to detect the current output voltage VOUT+ and the previous output voltage VOUT−, and a charge capacity or a discharge capacity of the output stage circuit 230 for the load may then be enhanced based on a detection result. In the present embodiment, the detection circuit 222 enhances the charge capacity of the output stage circuit 230 for the load when the previous output voltage VOUT− is greater than the current output voltage VOUT+ based on the detection result. On the contrary, the detection circuit 222 enhances the discharge capacity of the output stage circuit 230 for the load when the previous output voltage VOUT− is less than the current output voltage VOUT+ based on the detection result. Specific steps for the detection circuit 222 to enhance the driving capacity of the output stage circuit 230 are described as follows.

Take the class AB output stage circuit as an example, the output stage circuit of the present embodiment includes a P-type transistor Pout1 and a N-type transistor Nout2. A source of the P-type transistor Pout1 is coupled to a system voltage VDD. A drain of the P-type transistor Pout1 is served as an output terminal of the output stage circuit 230. A gate of the P-type transistor Pout1 is served as a first control terminal A coupled to the detection circuit 222. A drain of the N-type transistor Nout2 is coupled to the drain of the P-type transistor Pout1. A source of the N-type transistor Nout2 is coupled to a ground voltage. A gate of the N-type transistor Nout2 is served as the second control terminal B coupled to the detection circuit 222.

In the present embodiment, the detection circuit 222 turns on the P-type transistor Pout1 by decreasing a gate voltage of the P-type transistor Pout1, so as to enhance the charge capacity of the output stage circuit 230 for the load. Similarly, the detection circuit 222 turns on the N-type transistor Nout2 by increasing a gate voltage of the N-type transistor Nout2, so as to enhance the discharge capacity of the output stage circuit 230 for the load. From another perspective, decreasing of the gate voltage of the P-type transistor Pout1 is to increase the gate-to-source voltage drop V1 of the P-type transistor Pout1. Increasing of the gate voltage of the N-type transistor Nout2 is to increase the gate-source drop voltage V2 of the N-type transistor Nout2.

In summary, in a transient response of the operational amplifier circuit 200, an output switch 240 is first being turned off by a switch control signal SW1, so that the previous output voltage VOUT− may maintain at the same voltage value charged in a previous driving time point. Next, after the detection circuit 222 is enabled by the enable signal EN, the detection circuit 222 may compare a magnitude relation between the current output voltage VOUT+ and the previous output voltage VOUT−. When the current output voltage VOUT+ is greater than the previous output voltage VOUT−, the detection circuit 222 may decrease voltages of the first control terminal A and the second control terminal B, so that the gate-to-source voltage drop V1 of the P-type transistor Pout1 may be increased to enhance the charge capacity of the output stage circuit 230 for the load. Similarly, when the current output voltage VOUT+ is less than the previous output voltage VOUT−, the detection circuit 222 may increase the voltages of the first control terminal A and the second control terminal B, so that the gate-to-source voltage drop V2 of the N-type transistor Nout2 may be increased to enhance the discharge capacity of the output stage circuit 230 for the load.

In the present embodiment, the output stage circuit 230 is illustrated using the class AB output stage circuit as an example, but the disclosure is not limited thereto. The concept of dynamically detecting the output voltage value of the output stage circuit may also be applied to embodiments of the output stage circuit being the class A output stage circuit or the class B output stage circuit, which are described as follows.

Figure 3:
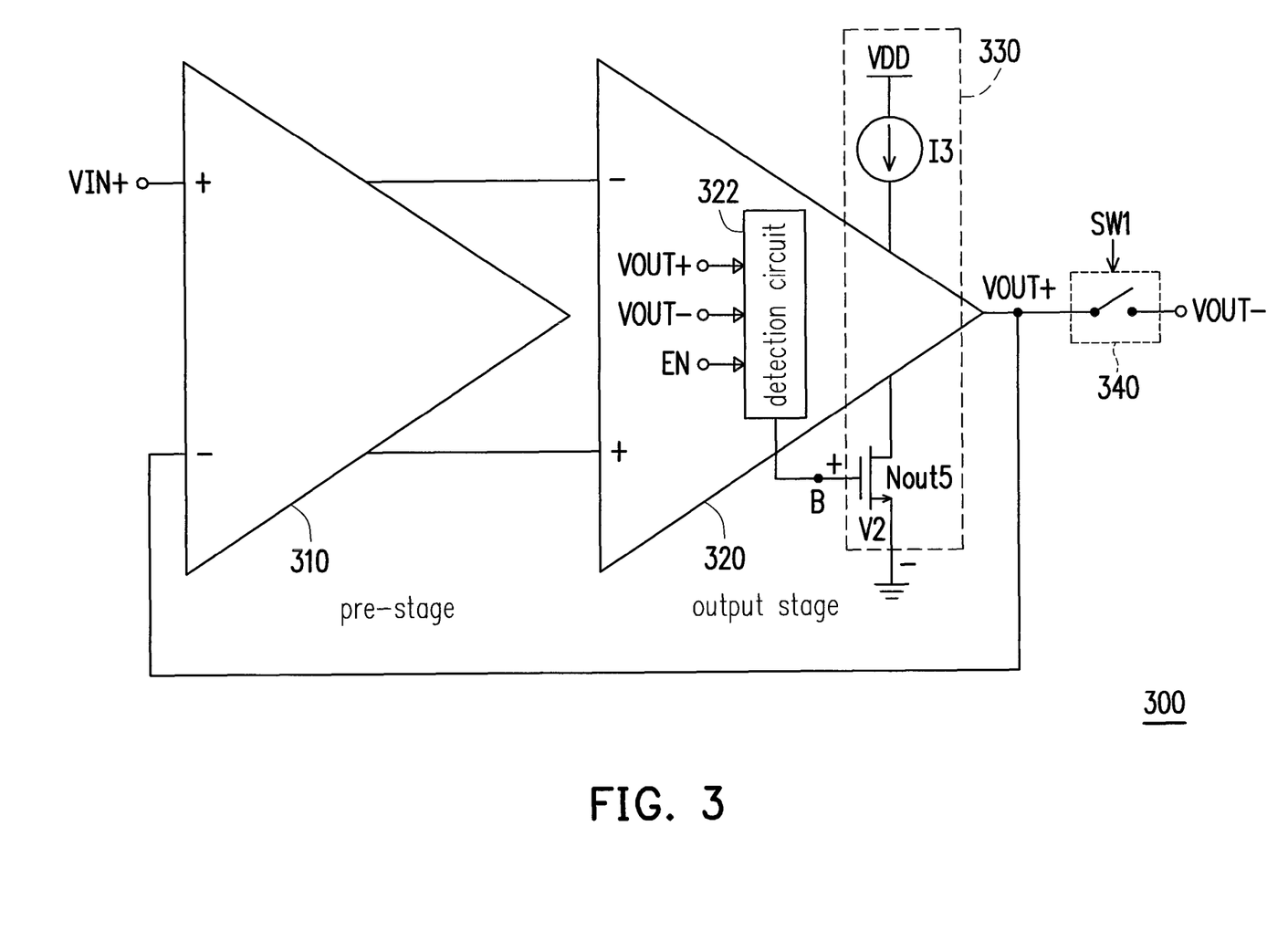
FIG. 3, FIG. 4 and FIG. 8 are schematic circuit diagrams illustrating the operational amplifier circuits according to other embodiments of the disclosure.

FIG. 3 is a schematic circuit diagram illustrating an operational amplifier circuit according to another embodiment of the disclosure. Referring to FIG. 2 and FIG. 3, an operational amplifier circuit 300 of the present embodiment is similar to the operational amplifier circuit 200 depicted in FIG. 2, their major difference is, for example, an output stage circuit 330 of the operational amplifier circuit 300 is a structure of the class A output stage circuit, detailed description thereof is described as follows.

In the present embodiment, the output stage circuit 330 includes a current source I3 and an N-type transistor Nout5. A terminal of the current source I3 is coupled to the system voltage VDD. Another terminal of the current source is coupled to an output terminal of the output stage circuit 330. In the present embodiment, when the current source I3 is turned on, the current source I3 may charge the load, so as to enhance the charge capacity of the output stage circuit 330 for the load. A drain of the N-type transistor Nout5 is coupled to the output terminal of the output stage circuit 330. A source of the N-type transistor Nout5 is coupled to the ground voltage. A gate of the N-type transistor Nout5 is served as the second control terminal B coupled to a detection circuit 322. In the present embodiment, the detection circuit 322 turns on the N-type transistor Nout5 by increasing a gate voltage of the N-type transistor Nout5, so as to enhance the discharge capacity of the output stage circuit 330 for the load.

Figure 4:
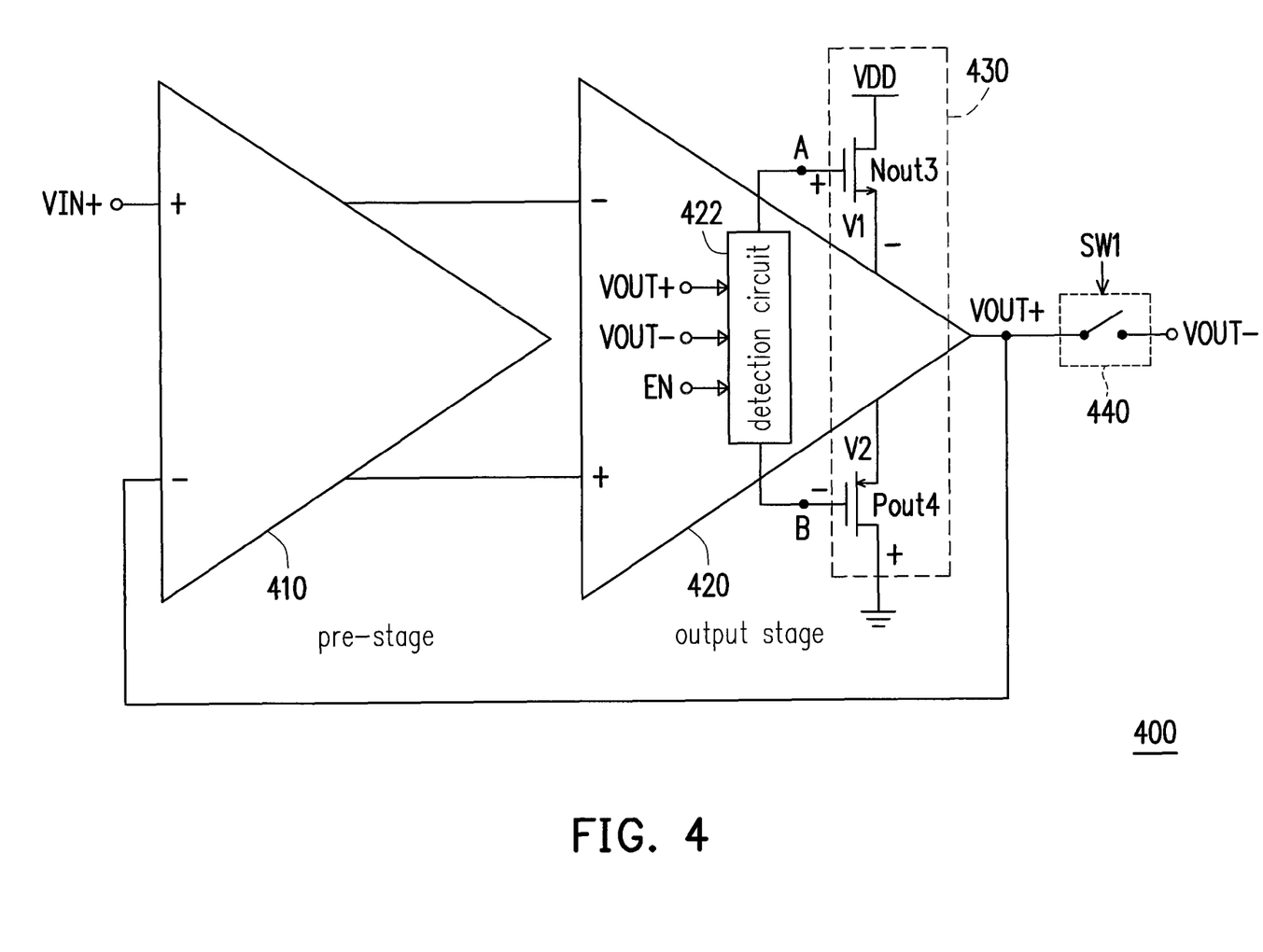

FIG. 4 is a schematic circuit diagram illustrating an operational amplifier circuit according to another embodiment of the disclosure. Referring to FIG. 2 and FIG. 4, an operational amplifier circuit 400 of the present embodiment is similar to the operational amplifier circuit 200 depicted in FIG. 2, their major difference is, for example, an output stage circuit 430 of the operational amplifier circuit 400 is a structure of the class B output stage circuit, detailed description thereof is described as follows.

In the present embodiment, the output stage circuit 430 includes a N-type transistor Nout3 and a P-type transistor Pout4. A drain of the N-type transistor Nout3 is coupled to the system voltage. A source of the N-type transistor Nout3 is served as an output terminal of the output stage circuit. A gate of the N-type transistor Nout3 is served as the first control terminal A coupled to the detection circuit. The detection circuit turns on the N-type transistor Nout3 by increasing a gate voltage of the N-type transistor Nout3, so as to enhance the charge capacity of the output stage circuit for the load. A source of the P-type transistor Pout4 is coupled to the drain of the N-type transistor Nout3. A drain of the P-type transistor Pout4 is coupled to the ground voltage. A gate of the P-type transistor Pout4 is served as the second control terminal B coupled to the detection circuit. The detection circuit turns on the P-type transistor Pout4 by decreasing a gate voltage of the P-type transistor Pout4, so as to enhance the discharge capacity of the output stage circuit 430 for the load.

Figure 5:
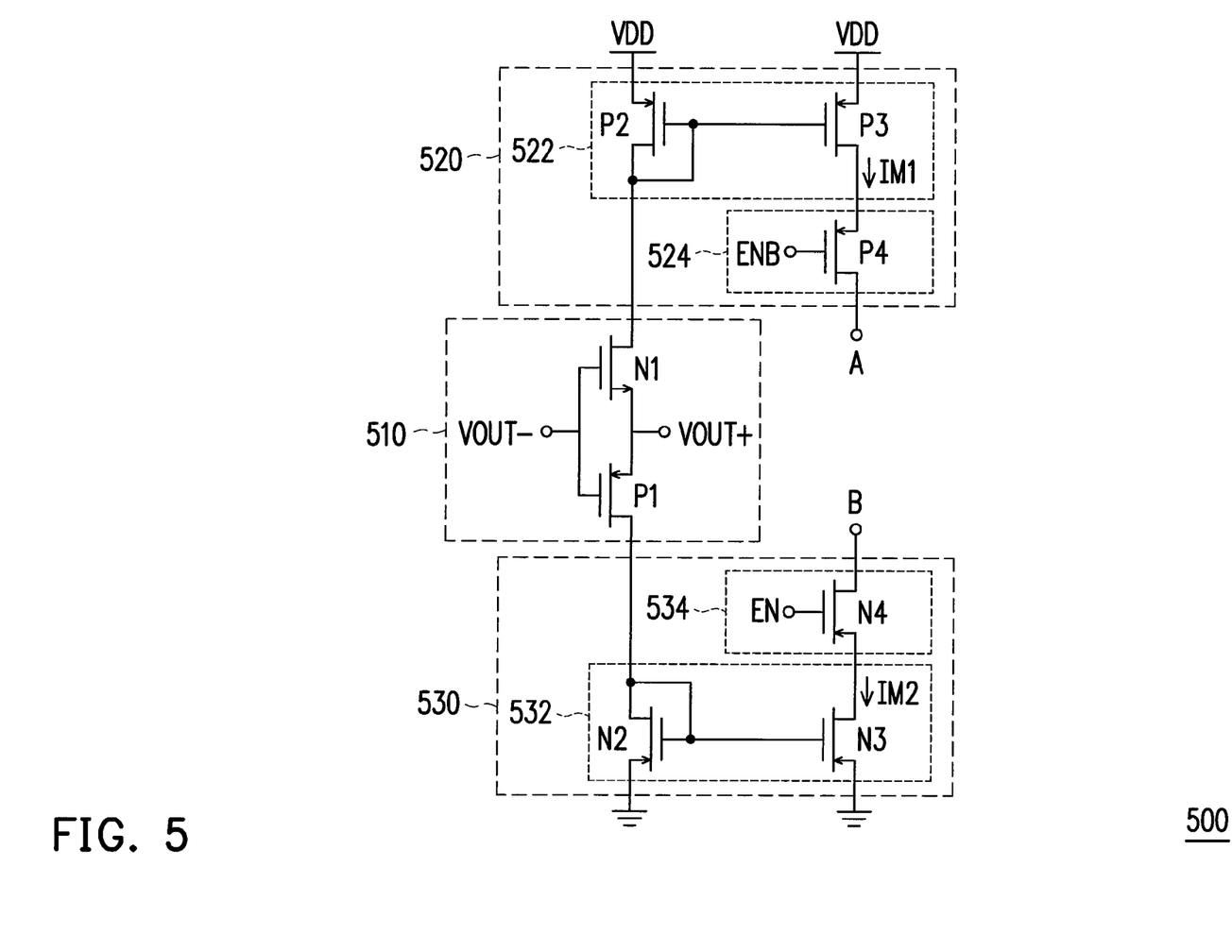
FIG. 5 is a schematic circuit diagram illustrating a detection circuit according to an embodiment of the disclosure.

FIG. 5 is a schematic circuit diagram illustrating a detection circuit according to an embodiment of the disclosure. Referring to FIG. 5, a detection circuit 500 of the present embodiment may be, for example, applied to the operational amplifier circuit in any one of the above disclosed embodiments. In the present embodiment, the detection circuit 500 includes a differential input pair 510, a first current mirror module 520 and a second current mirror module 530. Therein, the first current mirror module 520 includes a first current minor 522 and a first switch 524. The second current mirror module 530 includes a second current mirror 532 and a second switch 534.

In the present embodiment, two terminals of the differential input pair 510 respectively receive the previous output voltage VOUT− and the current output voltage VOUT+. Further, the magnitude relation of the previous output voltage VOUT− and the current output voltage VOUT+ determines which one of transistors N1 or P1 is to be turned on. The first current mirror 522 is coupled to the differential input pair 510, and the first switch 524 is controlled by an inverted enable signal ENB. The second current mirror 532 is coupled to the differential input pair 510, and the second switch 534 is controlled by an enable signal EN. In the present embodiment, when the previous output voltage VOUT− is greater than the current output voltage VOUT+, the transistor N1 is turned on, and the first switch 524 is turned on by the inverted enable signal ENB. In this case, the first current mirror 522 provides a first current IM1 to the first control terminal A of the output stage circuit, so as to decrease or increase the voltage of the first control terminal A. On the contrary, when the previous output voltage VOUT− is less than the current output voltage VOUT+, the transistor P1 is turned on, and the second switch 534 is turned on by the enable signal EN. In this case, the second current mirror 532 draws a second current IM2 from the second control terminal B of the output stage circuit, so as to decrease or increase the voltage of the second control terminal B.

More specifically, take the class AB output stage circuit as an example in the present embodiment, the transistors N1 and P1 may first determine the magnitude relation between the previous output voltage VOUT− and the current output voltage VOUT+. When the previous output voltage VOUT− is greater than a sum of the current output voltage VOUT+ and a threshold voltage Vtn of the transistor N1, the transistor N1 is turned on. The detection circuit 500 generates the first current IM1 to the operational amplifier circuit via transistors P2, P3 and P4, and then the first current IM1 charges the first control terminal A and the second control terminal B of the output stage circuit to increase voltages of the first control terminal A and the second control terminal B, so as to enhance the discharge capacity for the load. As a voltage difference between the previous output voltage VOUT− the current output voltage VOUT+ gets greater, a conduction degree of the transistor N1 may be greater, which results in that the first current IM1 provided to the operational amplifier being increased, and the gate voltage of the output stage transistor may dynamically adjust the driving capacity thereof based on the magnitude relation between the previous output voltage VOUT− and the current output voltage VOUT+. On the contrary, when the previous output voltage VOUT− is less than a difference between the current output voltage VOUT+ and an absolute value |Vtp| of a threshold voltage of the transistor P1, the transistor P1 may draw a current from a terminal (which is configured to receive the current output voltage VOUT+) of the differential input pair 510 to the transistor N2, and then transistors N3 and N4 may draw a second current IM2 from the output stage circuit. The voltages of first control terminal A and the second control terminal B may be decreased due to the current being drawn, so as to enhance the charge capacity of the output stage transistor. On the other hand, when the previous output voltage VOUT− is greater than the difference between the current output voltage VOUT+ and the absolute value |Vtp| of the threshold voltage of the transistor P1, and less than the sum of the current output voltage VOUT+ and the threshold voltage Vtn of the transistor N1, none of the transistors N1 and P1 of the differential input pair 510 is turned on so no additional current is input or output to/from the output stage circuit. Accordingly, the driving capacity of the output stage circuit maintains in a state as not being adjusted, and the output waveform is not overshoot.

In the present embodiment, the detection circuit may be directly connected to the first control terminal A and the second control terminal B, and to an operating point (which affects the current being input or output to/from the first control terminal A and the second control terminal B) in the operational amplifier circuit.

Figure 6:
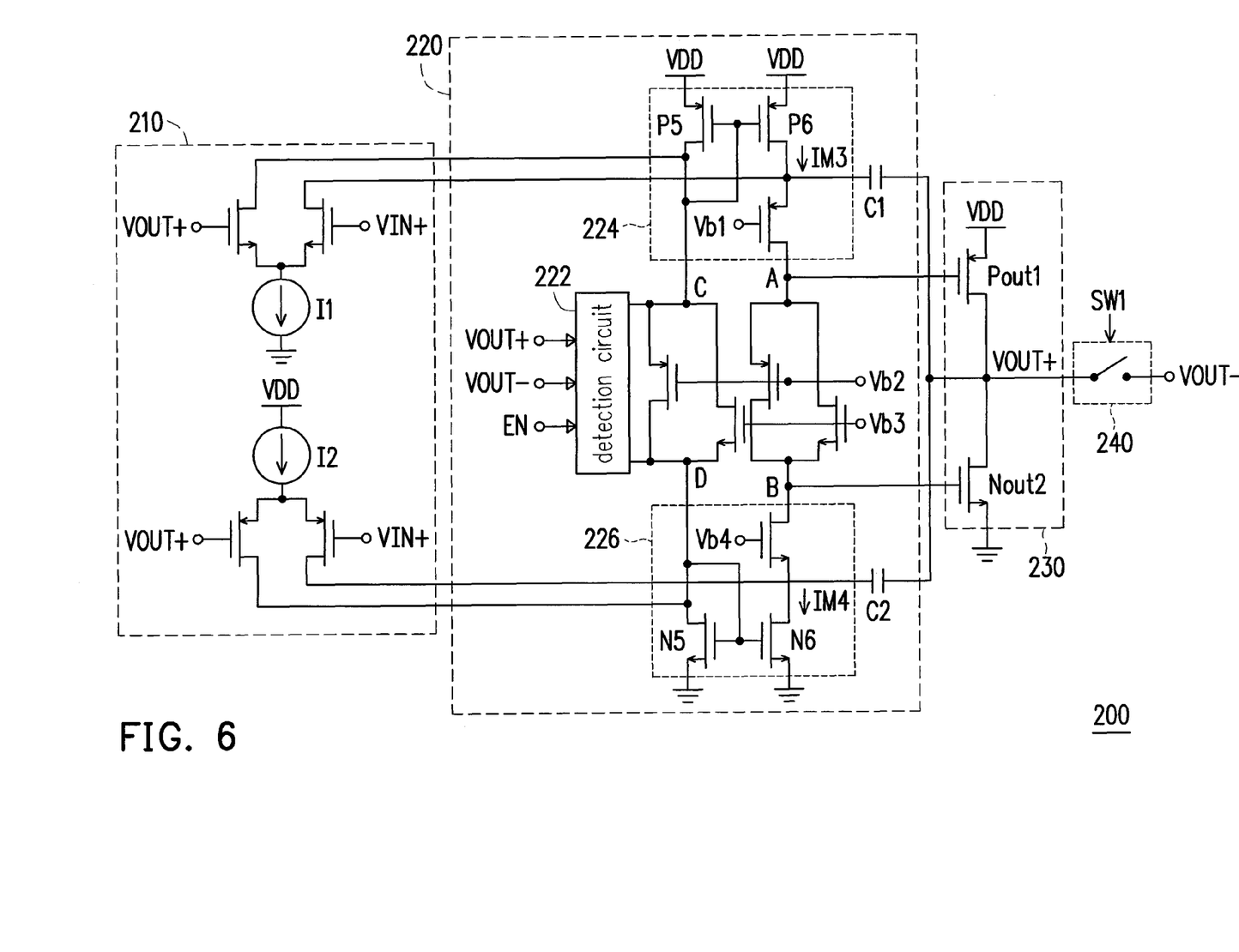
FIG. 6 is a circuit structure diagram of the operational amplifier circuit depicted in FIG. 2.
Figure 7:
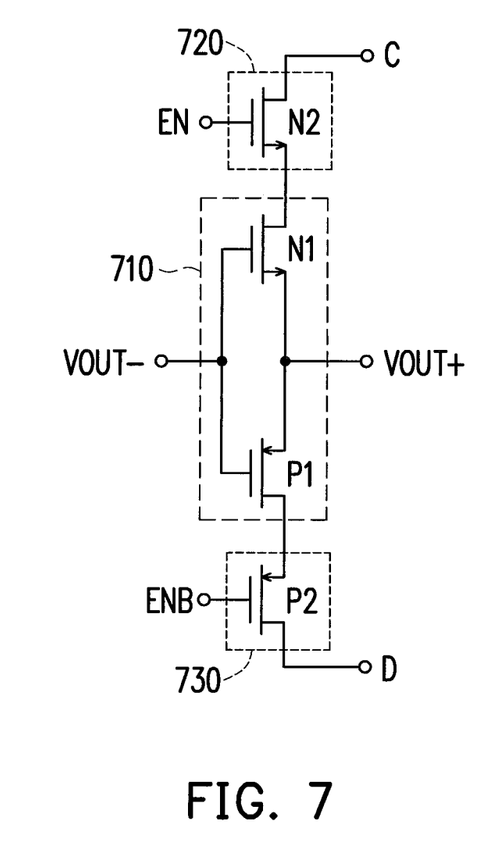
FIG. 7 is a circuit structure diagram of the detection circuit depicted in FIG. 6.

Take the class AB output stage circuit again as an example, FIG. 6 is a circuit structure diagram of the operational amplifier circuit depicted in FIG. 2, and FIG. 7 is a circuit structure diagram of the detection circuit depicted in FIG. 6. Referring to FIG. 6 and FIG. 7, the detection circuit 222 of the present embodiment includes a differential input pair 710, a first switch 720 and a second switch 730. Two terminals of the differential input pair respectively receive the previous output voltage VOUT− and the current output voltage VOUT+. A first terminal of the first switch 720 is coupled to the first control terminal A via a node C and a third current mirror module 224 in the output stage operational amplifier circuit 220. A second terminal of the first switch 720 is coupled to the differential input pair 710. A control terminal of the first switch 720 is controlled by the enable signal EN. A first terminal of the second switch 730 is coupled to the differential input pair 710. A second terminal of the second switch is coupled to the second control terminal B via a node D and a fourth current mirror module 226 in the output stage operational amplifier circuit 220. A control terminal of the second switch is controlled by the inverted enable signal ENB. In the present embodiment, when the previous output voltage VOUT− is greater than the current output voltage VOUT+, the enable signal EN turns on the first switch 720, so that the third current mirror module 224 may provide a third current IM3 to the first control terminal A. When the previous output voltage VOUT− is less than the current output voltage VOUT+, the inverted enable signal ENB turns on the second switch 730, so that the fourth current mirror module 226 may draw a fourth current IM4 from the second control terminal B.

More specifically, when the voltage difference between the previous output voltage VOUT− and the current output voltage VOUT+ is great enough to turn on the transistor N1, a current may be generated between the node C and the terminal (which is configured to receive the current output voltage VOUT+) of the differential input pair 710. Said current is directed to the terminal (which is configured to receive the current output voltage VOUT+) of the differential input pair 710 via the node C, the transistors N2 and N1. Next, the detection circuit 222 may map the same current IM3 to enter and charge the first control terminal A and the second control terminal B by utilizing transistors P5 and P6 of the third current mirror module 224, so that the voltage of the second control terminal B may be increased to enhance the discharge capacity of the N-type transistor Nout2. On the contrary, when the voltage difference between the previous output voltage VOUT− and the current output voltage VOUT+ is great enough to turn on the transistor P1, another current may be generated between the node D and the terminal (which are configured to receive the current output voltage VOUT+) of the differential input pair 710. Said current is directed to the node C via the terminal (which is configured to receive the current output voltage VOUT+) of the differential input pair 710, the transistors P2 and P1. Next, the detection circuit 222 may draw the same current IM4 to discharge the first control terminal A and the second control terminal B by utilizing transistors N5 and N6 of the fourth current mirror module 226, so that the voltage of the first control terminal A may be decreased to enhance the charge capacity of the P-type transistor Pout1.

In addition, in the present disclosure, the detection circuit is configured to compare the previous output voltage and the current output voltage, and responses by directing a proper current into the output stage operational amplifier, thus the detection circuit may also be implemented by using a comparator circuit.

Figure 8:
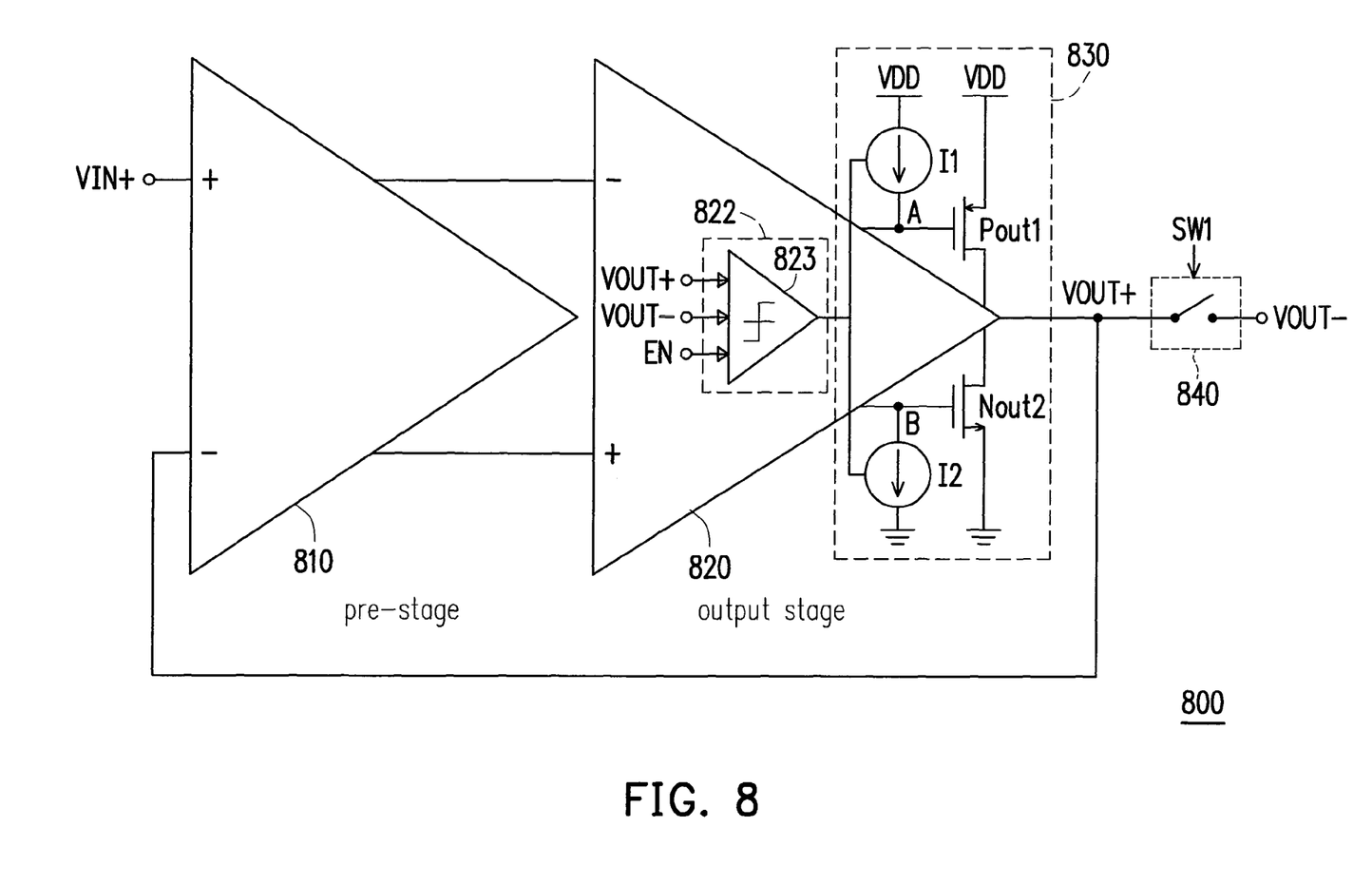

FIG. 8 is a schematic circuit diagram illustrating an operational amplifier circuit according to another embodiment of the disclosure. Referring to FIG. 2 and FIG. 8, an operational amplifier circuit 800 of the present embodiment is similar to the operational amplifier circuit 200 depicted in FIG. 2, their major difference is, for example, an output stage circuit 830 is implemented by another structure of the class AB output stage circuit and a detection circuit 822 includes a comparator circuit 823, detailed description thereof is described as follows.

In the present embodiment, the output stage circuit 830 further includes current sources I1 and I2 as compared to the output stage circuit 230. A terminal of the current source I1 is coupled to the system voltage VDD. A second terminal of the current source I1 is coupled to the gate of the P-type transistor Pout1 (i.e., the first control terminal A). When the current source I1 is turned on, the voltages of the first control terminal A and the second control terminal B may be increased to turn on the N-type transistor Nout2, so as to enhance the discharge capacity of the output stage circuit 830 for the load. On the other hand, a first terminal of the current source I2 is coupled to the gate of the N-type transistor Nout2 (i.e., the second control terminal B). A second terminal of the current source I2 is coupled to the ground voltage. When the current source I2 is turned on, the voltages of the first control terminal A and the second control terminal B may be decreased to turn on the P-type transistor Pout1, so as to enhance the charge capacity of the output stage circuit 830 for the load.

In addition to the present embodiment, the comparator circuit 823 is controlled by the enable signal EN and configured to compare the current output voltage VOUT+ and the previous output voltage VOUT−, so as to output a comparison result accordingly. More specifically, the comparator circuit 823 includes a first input terminal, a second input terminal, a control terminal and an output terminal. The first input terminal receives the previous output voltage VOUT−. The second input terminal receives the current output voltage VOUT+. The output terminal outputs the comparison result of above-said two voltages. The control terminal receives the enable signal EN. Therefore, the comparator circuit 823 may determine whether to compare the current output voltage VOUT+ and the previous output voltage VOUT− based on the enable signal EN.

In other words, the comparator circuit 823 may dynamically adjust the current values of the current sources I1 and I2 by determining the magnitude relation of the current output voltage VOUT+ and the previous output voltage VOUT−. When the previous output voltage VOUT− is greater than the current output voltage VOUT+, the comparator circuit 823 may turn on the current source I1 and turn off the current source I2. Accordingly, the first control terminal A and the second control terminal B may be charged to a high electric potential by the current source I1, so that the discharge capacity of the N-type transistor Nout2 may be enhanced. On the contrary, when the previous output voltage VOUT− is less than the current output voltage VOUT+, the comparator circuit 823 may turn off the current source I1 and turn on the current source I2. Accordingly, the first control terminal A and the second control terminal B may be discharged to a low electric potential by the current source I2, so that the charge capacity of the P-type transistor Pout1 may be enhanced.

Figure 9:
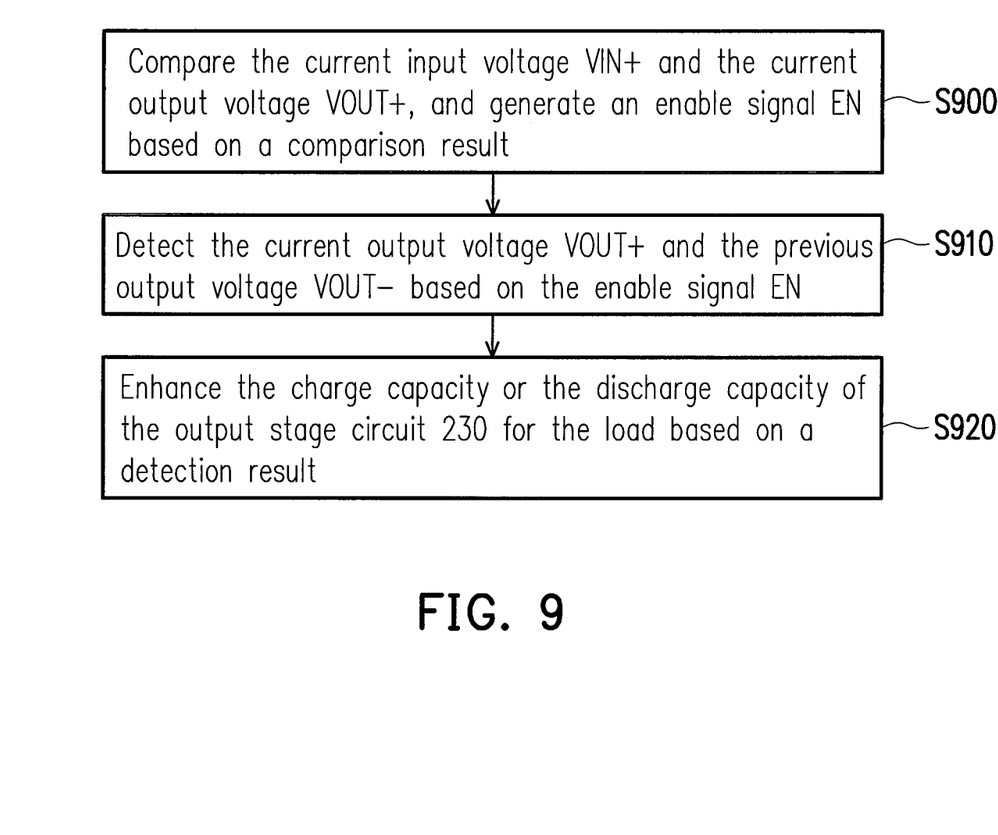
FIG. 9 is a flowchart illustrating a method for enhancing a driving capacity of the operational amplifier circuit.

FIG. 9 is a flowchart illustrating a method for enhancing a driving capacity of the operational amplifier circuit. Referring to FIG. 2 and FIG. 9, the method for enhancing the driving capacity according to the present embodiment is at least suitable for the operational amplifier as disclosed in above embodiments. In step S900, the pre-stage operational amplifier 210 compares the current input voltage VIN+ and the current output voltage VOUT+, and generates an enable signal EN based on a comparison result. Next in step S910, the detection circuit 222 detects the current output voltage VOUT+ and the previous output voltage VOUT− based on the enable signal EN. Further, in step S920, the detection circuit 222 enhances the charge capacity or the discharge capacity of the output stage circuit 230 for the load based on a detection result.

Besides, the method for enhancing the driving capacity of the operational amplifier circuit described in this embodiment of the disclosure is sufficiently taught, suggested, and embodied in the exemplary embodiments illustrated in FIG. 2 to FIG. 8, and therefore no further description is provided herein.

In view of above, according to the embodiments of the disclosure, the output stage module of the operational amplifier circuit includes the detection circuit. The detection circuit may dynamically detect the magnitude of the output voltage for adjusting the gate-to-source voltage drop of the output stage transistor, so as to enhance the charge/discharge capacity of the output circuit for the load or the next-stage circuit.

It will be apparent to those skilled in the art that various modifications and variations can be made to the structure of the disclosed embodiments without departing from the scope or spirit of the disclosure. In view of the foregoing, it is intended that the disclosure cover modifications and variations of this specification provided they fall within the scope of the following claims and their equivalents.

What is claimed is:

1. An operational amplifier circuit configured for driving a load, the operational amplifier circuit comprising:
   an output stage module comprising an output stage operational amplifier and an output stage circuit, and the output stage operational amplifier comprising a detection circuit, a first current mirror module and a second current mirror module, wherein the detection circuit is configured to detect a current output voltage and a previous output voltage and enhance a charge capacity or a discharge capacity of the output stage circuit for the load based on a detection result; and
   a pre-stage operational amplifier comprising four output terminals, wherein two of the four output terminals are coupled to the first current minor module, and the other two of the four output terminals are coupled to the second current minor module.

2. The operational amplifier circuit as recited in claim 1, wherein the detection circuit enhances the charge capacity of the output stage circuit for the load when the previous output voltage is greater than the current output voltage based on the detection result.

3. The operational amplifier circuit as recited in claim 1, wherein the detection circuit enhances the discharge capacity of the output stage circuit for the load when the previous output voltage is less than the current output voltage based on the detection result.

4. The operational amplifier circuit as recited in claim 1, wherein the output stage circuit comprises:
   a first transistor having a first terminal coupled to a first voltage, a second terminal served as an output terminal of the output stage circuit, and a control temiinal coupled to the detection circuit, wherein the detection circuit turns on the first transistor by decreasing a voltage of a control terminal of the first transistor, so as to enhance the charge capacity of the output stage circuit for the load; and
   a second transistor having a first terminal coupled to the first terminal of the first transistor, a second terminal coupled to a second voltage, and a control terminal coupled to the detection circuit, wherein the detection circuit turns on the second transistor by increasing a voltage of a control terminal of the second transistor, so as to enhance the discharge capacity of the output stage circuit for the load.

5. The operational amplifier circuit as recited in claim 4, wherein the output stage circuit further comprises:
   a first current source having a first terminal coupled to the first voltage, and a second terminal coupled to the control terminal of the first transistor, wherein when the first source is turned on, the voltage of the control terminal of the second transistor is increased to turn on the second transistor, so as to enhance the discharge capacity of the output stage circuit for the load.

6. The operational amplifier circuit as recited in claim 4, wherein the output stage circuit further comprises:
   a second current source having a first terminal coupled to the control terminal of the second transistor, and a second terminal coupled to the second voltage, wherein when the second source is turned on, the voltage of the control terminal of the first transistor is decreased to turn on the first transistor, so as to enhance the charge capacity of the output stage circuit for the load.

7. The operational amplifier circuit as recited in claim 1, wherein the output stage circuit comprises:
 a third transistor having a first terminal coupled to a first voltage, a second terminal served as an output terminal of the output stage circuit, and a control terminal coupled to the detection circuit, wherein the detection circuit turns on the third transistor by increasing a voltage of a control terminal of the third transistor, so as to enhance the charge capacity of the output stage circuit for the load; and
 a fourth transistor having a first terminal coupled to the first terminal of the third transistor, a second terminal coupled to a second voltage, and a control terminal coupled to the detection circuit, wherein the detection circuit turns on the fourth transistor by decreasing a voltage of a control terminal of the fourth transistor, so as to enhance the discharge capacity of the output stage circuit for the load.

8. The operational amplifier circuit as recited in claim 1, wherein the output stage circuit comprises:
 a third current source having a first terminal coupled to a first voltage, and a second terminal coupled to an output terminal of the output stage circuit, wherein when the third source is turned on, the third current source charges the load, so as to enhance the charge capacity of the output stage circuit for the load; and
 a fifth transistor having a first terminal coupled to an output terminal of the output stage circuit, a second terminal coupled to a second voltage, and a control terminal coupled to the detection circuit, wherein the detection circuit turns on the fifth transistor by increasing a voltage of a control terminal of the fifth transistor, so as to enhance the discharge capacity of the output stage circuit for the load.

9. The operational amplifier circuit as recited in claim 1, wherein the output stage circuit comprises a first control terminal and a second control terminal, and the detection circuit comprises:
 a differential input pair having a first terminal to receive the previous output voltage, and a second terminal to receive the current output voltage;
 a first switch having a first terminal coupled to the first control terminal via the first current mirror module, a second terminal coupled to the differential input pair, and a control terminal, wherein when the previous output voltage is greater than the current output voltage, the first switch is turned on for the first current mirror module to provide a first current to the first control terminal; and
 a second switch having a first terminal coupled to the differential input pair, a second terminal coupled to the second control terminal via the second current mirror module, and a control terminal, wherein when the previous output voltage is less than the current output voltage, the second switch is turned on for the second current mirror module to draw a second current from the second control terminal.

10. The operational amplifier circuit as recited in claim 1, wherein the detection circuit is enabled to detect the current output voltage and the previous output voltage when the current input voltage is greater or less than the current output voltage.

* * * * *